US005648718A

United States Patent [19]

Edwards

[11] Patent Number: 5,648,718

[45] Date of Patent: Jul. 15, 1997

[54] VOLTAGE REGULATOR WITH LOAD POLE STABILIZATION

[75] Inventor: William Ernest Edwards, St. Paul, Minn.

[73] Assignee: SGS-Thomson Microelectronics, Inc., Carrollton, Tex.

[21] Appl. No.: 536,436

[22] Filed: Sep. 29, 1995

[51] Int. Cl.[6] .................... G05F 1/40; G05F 1/44; H03F 1/36; H03F 3/52

[52] U.S. Cl. .................... 323/274; 323/280; 330/109

[58] Field of Search .................... 323/273, 274, 323/280, 275; 330/109

[56] References Cited

U.S. PATENT DOCUMENTS

| | | | |
|---|---|---|---|
| 3,946,328 | 3/1976 | Boctor | 330/109 |
| 4,628,247 | 12/1986 | Rossetti | 323/314 |
| 4,912,423 | 3/1990 | Milkovic et al. | 330/255 |
| 4,954,785 | 9/1990 | Segaram | 327/554 |
| 4,970,474 | 11/1990 | Kennedy et al. | 331/2 |
| 4,972,446 | 11/1990 | Kennedy et al. | 377/47 |
| 5,124,593 | 6/1992 | Michel | 307/521 |
| 5,338,977 | 8/1994 | Carbolante | 327/110 |
| 5,384,554 | 1/1995 | Abernethy | 331/153 |

OTHER PUBLICATIONS

Grebene, Alan: Bipolar and MOS Analog Integrated Circuit Design; John Wiley & Sons, New York, New York, 1984, pp. 706–712.

*Primary Examiner*—Peter S. Wong

*Assistant Examiner*—Bao Q. Vu

*Attorney, Agent, or Firm*—David V. Carlson; Theodore E. Galanthay; Lisa K. Jorgenson

[57] ABSTRACT

A voltage regulator with load pole stabilization is disclosed. The voltage regulator consists of an error amplifier, an integrator which includes a switched capacitor, a pass transistor, and a feed back circuit. In one embodiment, the integrator circuit includes an amplifier, a capacitor, and a switched capacitor which is driven by a voltage controlled oscillator. The voltage controlled oscillator changes its frequency of oscillation proportional to the output current. In another embodiment, the switched capacitor is driven by a current controlled oscillator whose frequency of oscillation is also proportional to the output current of the voltage regulator. When the output current demand is large, the controlled oscillators increase the frequency which decreases the effective resistance of the switched capacitor thereby changing the frequency of the zero to respond to the change in the load pole. Conversely, the effective resistance is increased as the current demand is decreased, also to respond to the decrease in load pole. Consequently, the disclosed voltage regulator has high stability without consuming excess power.

27 Claims, 2 Drawing Sheets

VOLTAGE REGULATOR WITH LOAD POLE STABILIZATION

BACKGROUND OF THE INVENTION

1. Field of the Invention

This invention relates to electronic circuits used as voltage regulators and more specifically to circuits and methods used to stabilize a voltage regulator.

2. Description of the Relevant Art

The problem addressed by this invention is encountered in voltage regulation circuits. Voltage regulators are inherently medium to high gain circuits, typically greater than 50 db, with low bandwidth. With this high gain and low bandwidth, stability is often achieved by setting a dominate pole set with the load capacitor. Achieving stability over a wide range of load currents with a low value load capacitor (~0.1 uF) is difficult because the load pole formed by the load capacitor and load resistor can vary by more than three decades of frequency and be as high as tens of KHz requiring the circuit to have a very broad bandwidth of greater than 3 MHz which is incompatible with the power process used for voltage regulators.

FIG. 1 shows a prior art solution to the stabilization problem. The voltage regulator 2 in FIG. 1 converts an unregulated Vdd voltage, 12 volts in this example, into a regulated voltage Vreg, 5 volts in this example. Amplifier 6, resistor 10, and capacitor 12 are configured as an integrator thereby providing a zero to cancel the pole of the load (load pole). The integrator drives pass transistor 8. Resistors 14 and 16 form a voltage divider circuit which is used to scale the output voltage such that the output voltage can be fed back to the inverting input of an error amplifier 4. Resistor 18 and capacitor 20 are not part of voltage regulator 2 but rather are the schematic representation of the typical load on the voltage regulator circuit.

In this prior art example, the pole associated with the pull down resistors and load can be calculated as:

$$f_{pole} = \frac{1}{2\Pi C_L R_L}$$

where $R_L$=resistance of the load=R14 and R16 in parallel with R18.

$C_L$=the capacitance of C20 which is typically around 0.1 microfarad.

Therefore, the pole associated with the prior art circuit is load dependent and can vary from 16 Hz to 32 KHz for an R14+R16 equal to 100 kilo-ohms and R18 ranging from 50 ohms to 1 mega-ohm. The wide variation of the pole frequency is difficult to stabilize, as will be appreciated by persons skilled in the art. A prior art solution to this problem is to change the pull down resistors R14+R16 from 500 kilo-ohms to around 500 ohms which changes the pole frequency to a range of 3.2 KHz to 32 KHz, which is a frequency spread of 1 decade instead of 3 decades. However, the power dissipated by the pull down resistor R18 increases, as shown below:

$$\text{power}=(12v-5v)(I_{load}+I_{pulldown})=(7v)(100\ mA)+(7v)(10\ mA)$$

Therefore, the 500 ohm resistor adds 70 milli-watts of power dissipation in the chip which is approximately a 10% increase in power dissipation for the added stability.

SUMMARY OF THE INVENTION

Therefore, it is an object of the invention to increase the stability of a voltage regulator without increasing the power dissipated in the circuit. Additionally, it is an object of the invention to have a load cancelling zero which follows the load pole. Further, it is an object of the invention to have an integration circuit which has a load cancelling zero (cancellation zero) which varies with load pole. These and other objects, features, and advantages of the invention will be apparent to those skilled in the art from the following detailed description of the invention, when read with the drawings and claims.

The invention can be summarized as a voltage regulator with load pole stabilization. The voltage regulator consists of an error amplifier, an integrator which includes a switched capacitor, a pass transistor, and a feed back circuit. In one embodiment, the integrator circuit includes an amplifier, a capacitor, and a switched capacitor which is driven by a voltage controlled oscillator. The voltage controlled oscillator changes its frequency of oscillation. As a function of the output current of the voltage regulator. In another embodiment, the switched capacitor is driven by a current controlled oscillator whose frequency of oscillation is also a function of the output current of the voltage regulator. When the output current demand is large, the controlled oscillators increase the frequency of oscillation which decreases the effective resistance of the switched capacitor, thereby changing the frequency of the cancellation zero to respond to the change in the load pole. Conversely, the effective resistance is increased as the current demand is decreased, also to respond to the decrease in load pole. Consequently, the disclosed voltage regulator has high stability without consuming excess power.

DETAILED DESCRIPTION OF THE PREFERRED EMBODIMENT

Figure 1:
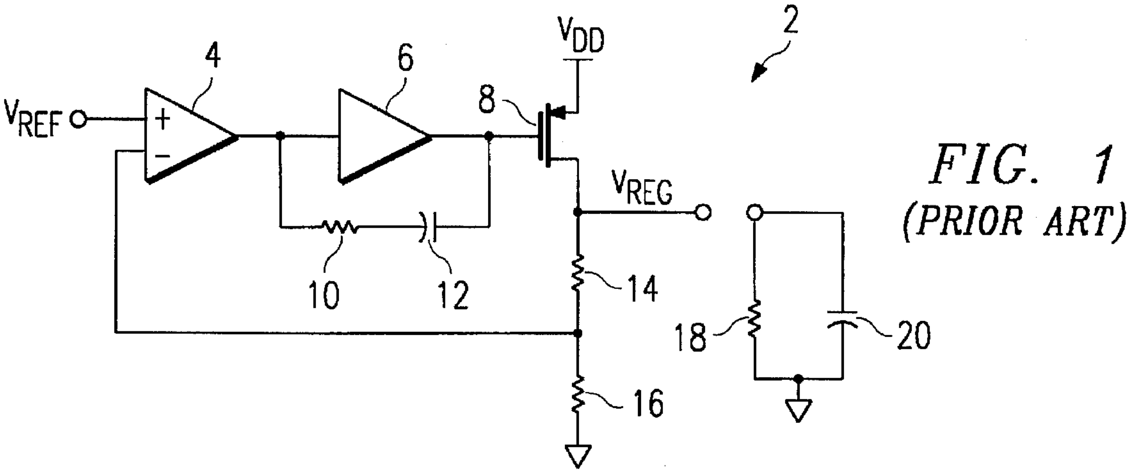
FIG. 1 (PRIOR ART)
FIG. 1 is a schematic diagram of a voltage regulator as is known in the prior art.

A voltage regulator constructed according to the embodiment of the invention in FIG. 2 will now be described. Error amplifier 24 has a noninverting input for receiving a Vref voltage. The output of error amplifier 24 is coupled to the integrator circuit and more specifically to the input of amplifier 26 and to the first end of switched capacitor 30. The second end of switched capacitor 30 is coupled to the first end of capacitor 32. The second end of capacitor 32 is connected to the output of amplifier 26, the gate of P-channel MOSFET pass transistor 28 and the input of voltage controlled oscillator 42. The output of the voltage control oscillator 42 is coupled to the input of the switched capacitor 30. The source of pass transistor 28 is connected to a voltage source Vdd. The drain of pass transistor 28 forms the output of voltage regulator 22 and is connected to the first end of resistor 34. The second end of resistor 34 is connected to the first end of resistor 36 and the inverting input of error amplifier 24. The second end of resistor 36 is connected to ground.

In operation, the reference voltage Vref is compared to the regulated voltage Reg through the feedback circuit formed by resistor 34 and resistor 36. More specifically, resistors 34 and 36 are configured as a voltage divider to scale the Vreg voltage which is then fed back to the inverting input of the error amplifier.

The integrator formed by amplifier 26, switched capacitor 30 and capacitor 32 has a zero with a frequency at $$f_{zero} = \frac{1}{2\pi C_{32} R_{eff}}$$

where $$R_{eff} = \frac{1}{f_{vco} C_{30}}$$

Thus, the pass transistor 28 regulates the Vreg voltage responsive to the error amplifier 24 and integrator output.

Figure 2:
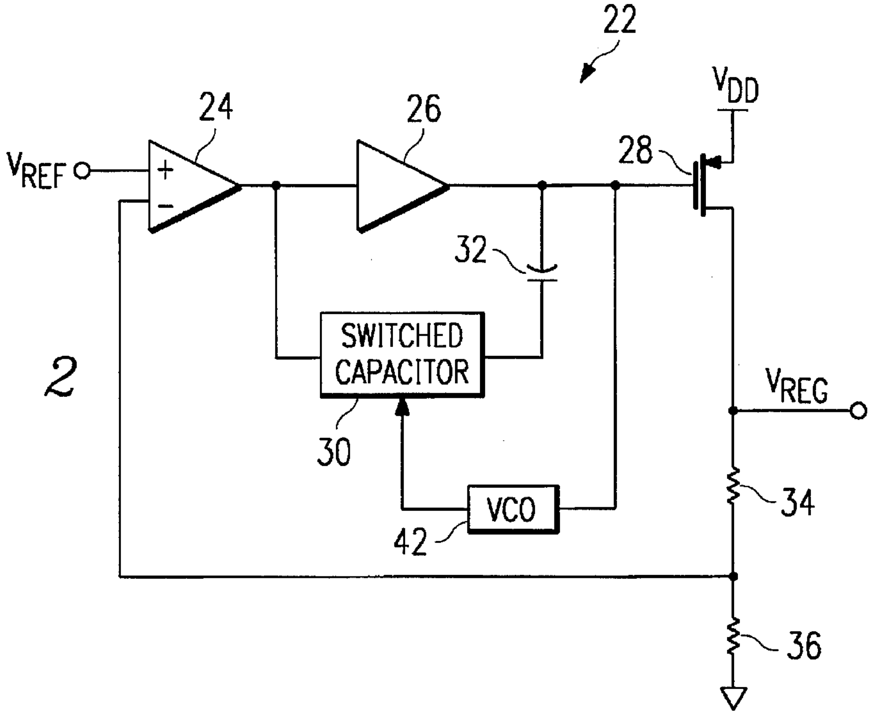
FIG. 2 is a schematic diagram of a voltage regulator with a switched capacitor, driven by a voltage control oscillator, in the integrator circuit.

FIG. 2 also shows the switched capacitor 30 being switched at a frequency controlled by the voltage control oscillator 42. The input to the voltage control oscillator 42 is connected to the output of the integrator circuit. The operation of this circuit can be described with the following equations:

$$f_{pole} = \frac{1}{2\Pi R_L C_L}$$

$$f_{zero} = \frac{1}{2\Pi C_{32} R_{eff}}$$

By setting the load pole frequency equal to the zero frequency and solving for the VCO frequency, we obtain:

$$fvco = \frac{C_{32}}{C_{30}} \cdot \frac{1}{R_L C_L}$$

and, $$fvco = \frac{C_{32}}{C_{30}} \cdot \frac{I_{load}}{V_{reg}} \cdot \frac{1}{C_L}$$

Therefore, the VCO frequency is proportional to the switching capacitor C32 and to the output current in this example. Thus, the cancellation zero generated by the integrator follows the lead pole as the lead changes. Persons skilled in the art will be able to utilize these equations to design a voltage regulator which meets their design criteria.

The invention increases the stability of the voltage regulator 22 without increasing the power dissipated by the circuit. This is accomplished by having a lead cancelling zero which follows the lead pole without having use low resistance pull down resisters which dissipate excessive power, as described above.

Figure 3:
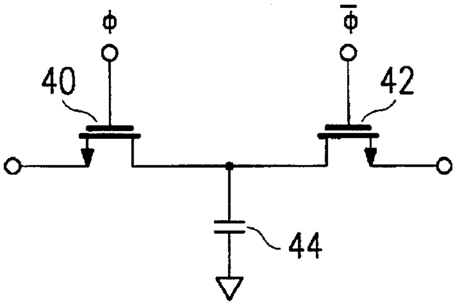
FIG. 3 (PRIOR ART)
FIG. 3 is a schematic diagram of a switched capacitor as known in the prior art.

The construction of a switched capacitor as illustrated in FIG. 3 will now be described. FIG. 3 shows switched capacitor having a first end connected to the drain of MOSFET transistor 40 and the drain of MOSFET transistor 42 and having a second end connected to ground. The source of transistor 40 forms the input to the switched capacitor and the source of transistor 42 forms the output of the switched transistor. The gate of transistor 40 is shown to receive a signal ϕ while the gate of transistor 42 is shown to receive the inverted signal ϕbar. It will be understood by persons skilled in the art that transistors 40 and 42, although shown as N-channel transistors, could be P-channel MOSFETs, bipolar transistors, or any equivalent thereof.

Figure 4A:
FIG. 4 is a timing diagram describing the operation of a switched capacitor.
Figure 4B:
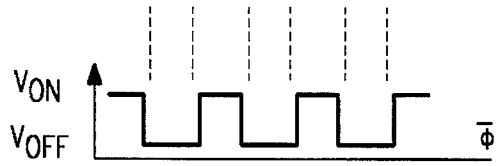
Figure 4C:
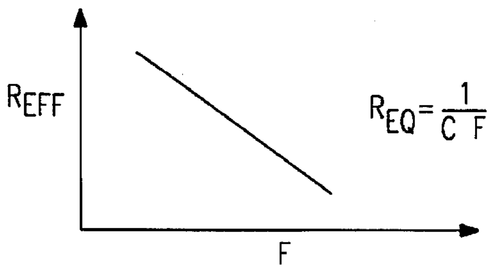

FIG. 4 shows the input timing signals as well as the effective resistance of the circuit as a function of frequency. FIG. 4*a* shows the input waveform ϕ which would be applied to the gate of transistor 40. FIG. 4*b* shows the timing waveform for the signal ϕ bar which would go on the input of transistor 42. It should be noted that these are non-overlapping waveforms. Therefore, transistor 40 is never on at the same time that transistor 42 is on. FIG. 4c shows that the effective resistance $R_{eff}$ of the switched capacitor decreases as the frequency increases. Conversely, the effective resistance $R_{eff}$ increases as frequency decreases.

Figure 5:
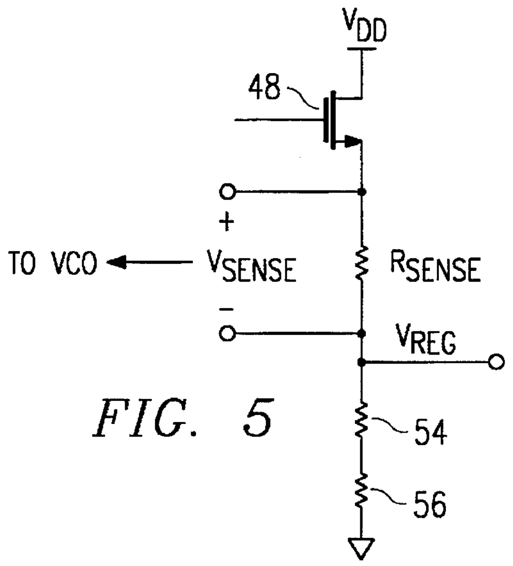
FIG. 5 is a schematic diagram of a voltage sense circuit which can be used in conjunction with a voltage control oscillator.

FIG. 5 illustrates a circuit which provides a voltage which is proportional to the output current of the voltage regulator. The circuit in FIG. 5 provides an alternative embodiment to the method for driving the VCO in FIG. 2.

More specifically, FIG. 5 shows a pass transistor 44 connected in series with a sense resistor Rsense to generate a voltage which can be used by a VCO. FIG. 5 is shown as an alternative to connecting the VCO to the gate of the pass transistor 28 in FIG. 2. Further, FIG. 5 shows the first end of the resistor Rsense connected to the source of pass transistor 48. The second end of Rsense forms the output of the voltage regulator and is coupled to the first end of resistor 54. The second end of resistor 54 is connected to first end of resistor 56. The second end of resistor 56 is connected to ground. It will be appreciated by persons skilled in the art that Rsense would be selected such that the voltage drop across Rsense is minimized.

With Rsense configured in this manner, a voltage Vsense is generated which is proportional to the output current of the voltage regulator. This voltage can subsequently be used to drive the VCO.

Figure 6:
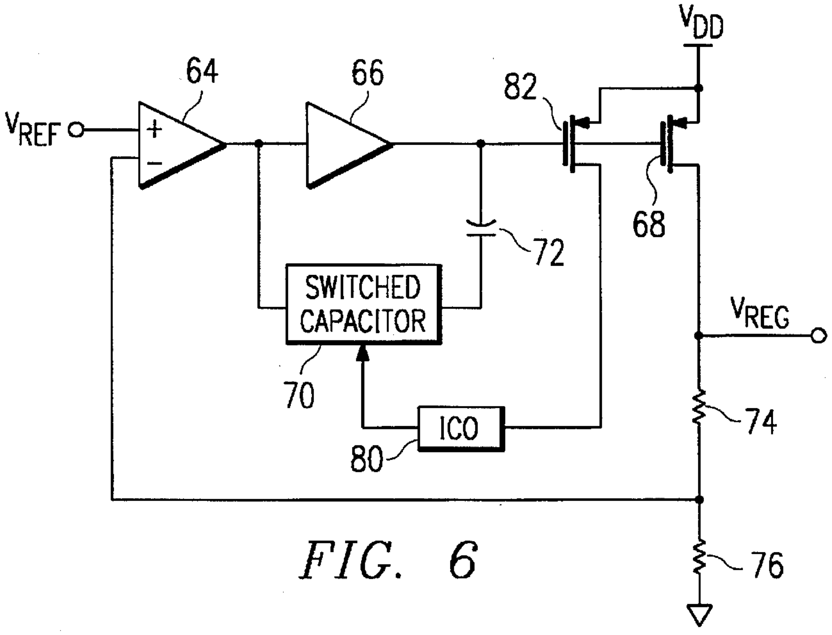
FIG. 6 is another embodiment of a voltage regulator with a switched capacitor driven by a current controlled oscillator.

And yet another embodiment is shown in FIG. 6. The embodiment in FIG. 6 differs from the embodiment in FIG. 2 in that the switched capacitor 70 is controlled by a current controlled oscillator (ICO) whereas the switched capacitor 30 in FIG. 2 is controlled by a voltage control oscillator.

The voltage regulator in FIG. 6 is constructed by having an error amplifier 64 receive a reference voltage Vref into its noninverting input. The output of the error amplifier 64 is connected to the input of amplifier 66 and to the first end of switched capacitor 70. The output of amplifier 66 is connected to a gate of P-channel transistor 82 and the gate of P-channel transistor 68 and the second end of capacitor 72. The first end of capacitor 72 is connected to the second end of switched capacitor 70. The frequency input of switched capacitor 70 is connected to the output of ICO 80. The input of ICO 80 is connected to the drain of transistor 82. The drain of transistor 68 forms the output of the voltage regulator and is connected to the first end of resistor 74. The second end of resistor 74 is connected to the inverting input of the error amplifier and the first end of resistor 76. The second end of resistor 76 is connected to ground.

The voltage regulator circuit in FIG. 6 operates essentially the same way as the circuit in FIG. 2. The difference between these two circuits is that the circuit in FIG. 6 mirrors the output current by having the gate of transistor 82 connected to the gate of transistor 68. Therefore as the output current through transistor 68 increases, the current going into the ICO 80 also increases. As the current at the input of the ICO increases, the frequency coming out of the ICO and going into the switched capacitor 70 increases. Therefore, the resistance of switched capacitor 70 decreases. Like the circuit in FIG. 2, the cancellation zero generated by the integrator follows the load pole as the load changes.

Therefore, the invention increases the stability of the voltage regulator 22 without increasing the power dissipated by the circuit. This is accomplished by having a load cancelling zero which follows the load pole.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A voltage regulator circuit having an error amp, an amplifier, a pass transistor, and a feedback circuit, wherein the amplifier further comprises:

a compensation capacitor coupled to the amplifier; and a switched capacitor having a clock input coupled to an output of the amplifier, the switched capacitor operable to vary the zero of the voltage regulator as a function of the current draw on the voltage regulator output.

2. The voltage regulator circuit of claim 1, further comprising a variable oscillator coupled between the output of the amplifier and the clock input of the switched capacitor, and operable to switch the switched capacitor at a frequency proportional to a current demand on the voltage regulator.

3. The voltage regulator circuit of claim 1 further comprising a voltage controlled oscillator having an input coupled to the output of the amplifier and having an output coupled to the clock input of the switched capacitor.

4. The voltage regulator of claim 1 further comprising a current controlled oscillator having an input coupled to the output of the amplifier and having an output coupled to the clock input of the switched capacitor.

5. The voltage regulator of claim 1 wherein the switched capacitor comprises:

a first transistor having a drain, source, and a gate for receiving a clock signal from a variable frequency source;

a capacitor having a first end coupled to the drain of the first transistor and having a second end coupled to ground; and a second transistor having a drain coupled to the first end of the capacitor, having a source, and having a gate for receiving an inverted clock signal from the variable frequency source.

6. The voltage regulator circuit of claim 5 wherein the variable frequency source comprises a voltage controlled oscillator.

7. The voltage regulator circuit of claim 5 wherein the variable frequency source comprises a current controlled oscillator.

8. The voltage regulator circuit of claim 5 wherein the first transistor and the second transistor are MOSFET transistors.

9. A voltage regulator circuit comprising:

an error amp having a noninverting input for receiving a reference voltage, an inverting input, and an output;

an amplifier with an input coupled to the output of the error amp and having an output;

a compensation capacitor coupled to the amplifier;

a switched capacitor having a clock input coupled to the output of the amplifier and operable to vary the zero of the voltage regulator as the output current of the voltage regulator varies;

a pass transistor having a current path with a first end coupled to a voltage source and a second end coupled to an output of the voltage regulator, and having a control input coupled to the output of the amplifier; and a feedback path coupled between the second end of the conductive path of the pass transistor and the inverting input of the error amp.

10. The voltage regulator circuit of claim 9, further comprising a variable oscillator coupled between the output of the amplifier and the clock input of the switched capacitor, and operable to switch the switched capacitor at a frequency proportional to a current demand on the voltage regulator.

11. The voltage regulator circuit of claim 9 further comprising a voltage controlled oscillator having an input coupled to the output of the amplifier and having an output coupled to the clock input of the switched capacitor.

12. The voltage regulator of claim 9 further comprising a current controlled oscillator having an input coupled to the output of the amplifier and having an output coupled to the clock input of the switched capacitor.

13. The voltage regulator of claim 9 wherein the switched capacitor comprises:

a first transistor having a drain, source, and a gate for receiving a clock signal from a variable frequency source;

a capacitor having a first end coupled to the drain of the first transistor and having a second end coupled to ground; and a second transistor having a drain coupled to the first end of the capacitor, having a source, and having a gate for receiving an inverted clock signal from the variable frequency source.

14. The voltage regulator circuit of claim 13 wherein the variable frequency source comprises a voltage controlled oscillator.

15. The voltage regulator circuit of claim 13 wherein the variable frequency source comprises a current controlled oscillator.

16. The voltage regulator circuit of claim 13 wherein the first transistor and the second transistor are MOSFET transistors.

17. A method for stabilizing a regulating voltage from a voltage regulator with a load pole by generating a load pole cancelling zero comprising the steps of:

generating a clock signal having a frequency that varies with the load current of the voltage regulator; and driving a switched capacitor with the generated clock signal to vary the zero of the voltage regulator as a function of the load current.

18. A method of claim 17 wherein the step of generating a clock signal is implemented using a voltage control oscillator.

19. The method of claim 17 wherein the step of generating a clock signal is implemented using a current control oscillator.

20. A power supply which includes a voltage regulating circuit comprising:

an error amp having a noninverting input for receiving a reference voltage, an inverting input, and an output;

an integrator circuit comprising:

an amplifier with an input coupled to the output of the error amp and having an output, a switched capacitor and a capacitor coupled in series across the input and output of the amplifier, the switched capacitor operable to vary the zero of the voltage regulating circuit as a function of the current draw on the voltage regulating circuit;

a pass transistor having a current path with a first end coupled to a voltage source and a second end, and having a control element coupled to the output of the integrator circuit; and a feedback circuit coupled between the second end of the conductive path of the pass transistor and the inverting input of the error amp.

21. A voltage regulator circuit comprising:

an error amp having a first input for receiving a reference voltage, a second input, and an output;

an amplifier having an input coupled to the output of the error amp and having an output;

a compensation capacitor coupled to the amplifier;

a switched capacitor coupled to the amplifier and having a clock input;

a variable oscillator having an input coupled to the output of the amplifier and an output coupled to the clock input of the switched capacitor, the variable oscillator and the switched capacitor together operable to vary the zero of the voltage regulator to track the varying load pole of the voltage regulator; and a feedback path having one end coupled to the output of the amplifier and another end coupled to the second input of the error amp.

22. The voltage regulator of claim 21 wherein the capacitor and the switched capacitor are coupled in series between the input and output of the amplifier.

23. The voltage regulator of claim 21, further comprising a pass transistor coupled between a voltage source and an output of the voltage regulator, and having a control input coupled to the output of the amplifier.

24. The voltage regulator of claim 23, further comprising a sense resistor coupled between the pass transistor and the output of the voltage regulator, the two ends of the sense resistor being coupled to the input of the variable oscillator.

25. The voltage regulator of claim 23, further comprising a transistor coupled between the voltage source and the input of the variable oscillator, and having a control input coupled to the output of the amplifier.

26. The voltage regulator of claim 21, further comprising a voltage divider coupled between the output of the voltage regulator and the one end of the feedback path.

27. An automatic stabilization circuit for a voltage regulator having a regulating element coupled to an output terminal and connectable to a load, a feed back element, and an amplifier having input and output terminals, the automatic stabilization circuit comprising:

a variable oscillator having a control input coupled to the output terminal and an oscillator output generating a variable frequency clock signal whose frequency is dependent on changes in the load; and a switched capacitor circuit coupled to the amplifier to provide variable compensation to the amplifier, the switched capacitor circuit receiving the variable frequency clock signal and generating a variable impedance whose value varies in response to changes in the frequency of the variable frequency clock signal.

* * * * *